United States Patent
Oo et al.

(10) Patent No.: US 8,022,765 B1
(45) Date of Patent: Sep. 20, 2011

(54) SOURCE FOLLOWER WITH GAIN COMPENSATION, AND CIRCUITS AND METHODS FOR SOURCE FOLLOWER GAIN ERROR COMPENSATION

(75) Inventors: Kenneth Thet Zin Oo, Milpitas, CA (US); Pierte Roo, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 19 days.

(21) Appl. No.: 12/552,882

(22) Filed: Sep. 2, 2009

Related U.S. Application Data

(60) Provisional application No. 61/095,813, filed on Sep. 10, 2008.

(51) Int. Cl.
*H03G 3/30* (2006.01)
(52) U.S. Cl. .......................................... 330/285; 330/136
(58) Field of Classification Search ................ 330/136, 330/277, 285, 290
See application file for complete search history.

(56) References Cited

U.S. PATENT DOCUMENTS 7,304,540 B2 * 12/2007 Tu .................................. 330/290

* cited by examiner

*Primary Examiner* — Steven J Mottola

(57) ABSTRACT

Circuits and methods for compensating for an input-dependent gain error in a buffer and/or amplifier circuit, including applying a dynamic current to the input transistor. Circuits generally include a dynamic current supply coupled to a terminal of the input transistor, the dynamic current supply providing a compensating current. The compensating current can have a magnitude equal to the output impedance of the input transistor times a magnitude of the output voltage. The compensating current can be provided via a current mirror, or directly to a terminal of the input transistor. Methods generally include regulating variations in the current through the input transistor by sinking or sourcing a static current and a dynamic current at a terminal of the input transistor. The dynamic current can be regulated in response to a variation in the input signal.

22 Claims, 5 Drawing Sheets

FIG. 1
(Conventional)
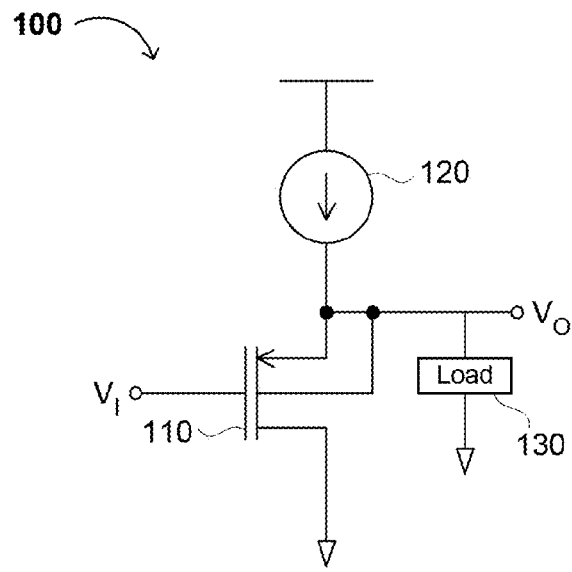
FIG. 2
(Conventional)
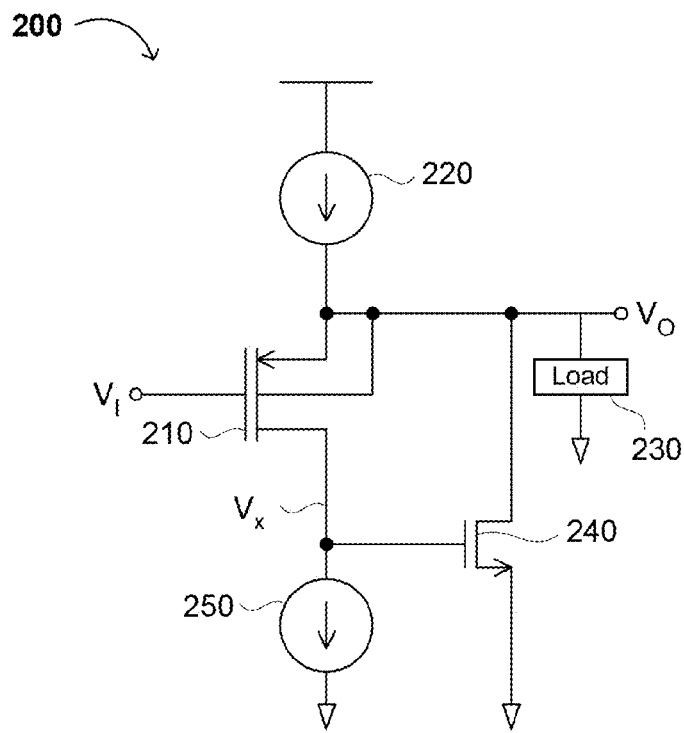

SOURCE FOLLOWER WITH GAIN COMPENSATION, AND CIRCUITS AND METHODS FOR SOURCE FOLLOWER GAIN ERROR COMPENSATION

RELATED APPLICATIONS

This application claims the benefit of U.S. Provisional Patent Application No. 61/095,813, filed Sep. 10, 2008, incorporated herein by reference in its entirety.

FIELD OF THE INVENTION

The present invention generally relates to the field of amplifier and/or buffer circuits. More specifically, embodiments of the present invention pertain to source follower circuits, and to circuits and methods for compensating for input-dependent gain error(s).

DISCUSSION OF THE BACKGROUND

Some conventional amplifiers or buffers include transistors in common-drain configurations. These buffers, commonly referred to as source followers, are advantageous over other amplifier or buffer circuits because of their ability to operate at high speed. Such buffers also enable circuits that provide an output having a high current drive from an input having a relatively low current drive capability. Source follower circuits are also commonly used as level-shifting circuits, for shifting DC bias points in analog or mixed signal circuitry. As illustrated in FIG. 1, a conventional source follower 100 can include a metal-oxide-semiconductor (MOS) input transistor 110 and a current supply 120 that drives a load 130 at the output of the source follower 100. In some implementations, transistor 110 can be a P-channel MOS (PMOS) transistor having a source terminal coupled to current supply 120 and a drain terminal coupled to a ground potential. An input signal $V_I$ is applied to a gate terminal of the input transistor 110, and an output signal $V_O$ (driving a load 130) is generated from the source terminal of input transistor 110.

There are numerous non-idealities of a typical source follower circuit. For example, the gain of a typical source follower circuit may be characterized by the following Equation (1):

$$\frac{V_O}{V_I} = \frac{1}{1 + \frac{g_{mb}}{g_m} + \frac{1}{g_m r_{ds}} + \frac{1}{g_m r_o} + \frac{1}{g_m R_L}} \quad (1)$$

where $g_m$, $g_{mb}$, and $r_{ds}$ are the transconductance, the back-gate transconductance, and the source-drain output resistance of the input transistor, respectively, $r_o$ is the current source output resistance, and $R_L$ is the load resistance. The loss due to the back-gate transconductance can be eliminated by coupling or tying the back gate, or body, of the transistor to the source (thus $g_{mb}$ is zero). However, even assuming ideal conditions (for example, where the current source 120 is ideal and the load 130 is purely capacitive, in which case $r_o$ and $R_L$ are infinite), the gain is still limited by the source-drain output resistance of the input transistor. Moreover, when the current source output resistance is not infinite, the current through the source-drain terminals of the transistor will be modulated due to voltage swings of the input signal (and thus also of the output signal), causing further gain errors and non-linearities.

A "super" source follower 200 is illustrated in FIG. 2. Source follower 200 reduces the voltage dependent gain error by regulating the current through the input transistor to be nearly constant using a feedback loop. The feedback loop in the source follower 200 includes an N-channel MOS (NMOS) transistor 240 having a drain terminal coupled to the source terminal of the input transistor 210, and a second current source 250 coupled to the drain of the input transistor 210 and the gate of the NMOS transistor 240. The second current source 250 is generally a static current source (i.e., the second current source 250 generally sinks a fixed current). The feedback loop reduces the current source output impedance, thereby improving linearity and also reducing the gain error contribution due to the resistive component of load 230. However, super source follower circuit 200 does not lessen the gain error contribution due to the finite source-drain output resistance of the input transistor 210.

Modern electronics requiring high-bandwidth, high-linearity, and/or low-noise designs challenge the conventional assumption that source followers and super source followers have little effect on the AC performance (for example, gain and frequency response) that is predominately caused by the finite source-drain output resistance of the input transistor.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention pertain to amplifier and/or buffer circuits and to circuits and methods for compensating for input-dependent gain error(s). More particularly, input-dependent gain error may be compensated by injecting compensating current which is about equal to the inverse of the output signal times the input transistor source-drain resistance into the input transistor.

In some embodiments, a circuit can include a metal-oxide-semiconductor (MOS) input transistor having a gate configured to receive an input signal, a first source/drain terminal producing an output signal responsive to the input signal, and a second source/drain terminal; a first current device coupled to the first source/drain terminal of the input transistor; a static current supply coupled to the second source/drain terminal of the input transistor; and a dynamic current supply coupled to the second source/drain terminal of the input transistor. In one embodiment, the dynamic current supply can be configured to vary a source-drain current of the input transistor in response to the input signal.

In further embodiments, the dynamic current supply can include a current mirror. The current mirror can include a first MOS transistor having a gate receiving the input signal, a first source/drain terminal coupled to a second current device, and a second source/drain terminal configured to control a variable current sourced to or sunk from the second source/drain terminal of the input transistor. Alternatively, the second source/drain terminal of the first MOS transistor may be directly or indirectly coupled to the second source/drain terminal of the input transistor (e.g., depending on whether the circuit is single-ended or differential). In some embodiments, the first transistor may have an identical conductivity type as the input transistor.

Additionally or alternatively, the current mirror can include a second MOS transistor and a third MOS transistor. A first source/drain terminal of the second transistor can be coupled to a gate of the second transistor, a gate of the third transistor, and the second source/drain terminal of the first transistor. A first source/drain terminal of the third transistor can be coupled to the second source/drain terminal of the input transistor. The second source/drain terminals of the second MOS and third MOS transistors can be coupled to a relatively constant electric potential (e.g., a voltage supply or a ground potential).

In some embodiments, the dynamic current supply can provide a compensating current having a magnitude about equal to an output impedance of the input transistor times a magnitude of the output signal. Further, the compensating current of the dynamic current supply can be about 180 degrees out of phase with a source-drain voltage of the input transistor. In some embodiments, the static current supply is in parallel with the dynamic current supply.

In additional embodiments, the circuit can also include an impedance compensation circuit receiving the output signal and coupled to the second source/drain terminal of the input transistor. The impedance compensation circuit can include a fourth MOS transistor (e.g., a "feedback" transistor) with a gate coupled to the second source/drain terminal of the input transistor and a first source/drain terminal coupled to the first source/drain terminal of the input transistor.

In some other embodiments, the circuit can operate in differential mode and further include a second MOS input transistor having a gate configured to receive a second input signal, a first source/drain terminal configured to produce a second output signal responsive to the second input signal, and a second source/drain terminal; a second current device coupled to the first source/drain terminal of the second input transistor; and a second static current supply coupled to the second source/drain terminal of the second input transistor. In these embodiments, the dynamic current supply can further be coupled to the second source/drain terminal of the second input transistor, and further be configured to vary a source-drain current of the second input transistor in response to the second input signal.

In further embodiments, the second source/drain terminal of the first MOS transistor of the dynamic current supply can be coupled to the second source/drain terminal of the first input transistor, and the dynamic current supply can further include a second MOS transistor having a gate configured to receive the second input signal, a first source/drain terminal coupled to a third current device, and a second source/drain terminal coupled to the second source/drain terminal of the second input transistor. The first and second MOS transistors of the dynamic current supply can have an identical conductivity type as the first and second input transistors. Additionally or alternatively, the dynamic current supply can also include an impedance device between the first source/drain terminals of the first and second MOS transistors of the dynamic current supply.

In some embodiments, an integrated circuit can include a first p-channel metal-oxide-semiconductor (PMOS) transistor having a gate configured to receive an input signal, a source receiving a first fixed current, a drain configured to receive a dynamic current, and a body coupled to the source of the first PMOS transistor; a n-channel metal-oxide-semiconductor (NMOS) transistor having a drain coupled to the source of the first PMOS transistor, and a gate coupled to the drain of the first PMOS transistor; and a second PMOS transistor having a gate receiving the input signal, a source receiving a second fixed current, a drain coupled to the drain of first PMOS transistor, and a body coupled to the source of the second PMOS transistor.

In further embodiments, the integrated circuit can operate in single-ended mode, and the integrated circuit can further include two MOS transistors coupling the drain of the first PMOS transistor and the drain of the second PMOS transistor. In alternative embodiments, the integrated circuit can operate in differential mode, and the circuit can further include a third PMOS transistor having a gate receiving a second input signal, a source receiving a third fixed current, a drain receiving a second dynamic current, and a body coupled to the source of the third PMOS transistor; a second NMOS transistor having a drain coupled to the source of the third PMOS transistor, and a gate coupled to the drain of the third PMOS transistor; a fourth PMOS transistor having a gate receiving the second input signal, a source receiving a fourth fixed current, a drain coupled to the drain of the third PMOS transistor, and a body coupled to the source of the fourth PMOS transistor; and an impedance device configured to couple the source of the second PMOS transistor and the source of the fourth PMOS transistor. In such differential mode embodiments, the second input signal is generally complementary to the first input signal.

In some embodiments, a method for reducing the non-linearity of a source follower can include regulating a first variation in a current through the source follower by sinking/sourcing a first current at a first source/drain terminal of the input transistor in response to a voltage at a second source/drain terminal of the input transistor; and regulating a second variation in the current through the input transistor due to a source-drain resistance of the input transistor by sinking/sourcing a dynamic current at the second source/drain terminal of the input transistor. Generally, the source follower includes an input transistor receiving an input signal and providing an output signal, the variation in the current is through the input transistor, and the variation can be due to a load at the second source/drain terminal of the input transistor and/or another node that is configured to receive the output signal. In advantageous embodiments, the step of sinking/sourcing the dynamic current can include regulating the dynamic current in response to a variation in the input signal.

The present invention provides for improved gain and frequency response in certain buffer, amplifier and/or level-shifting circuits by compensating for one or more errors resulting from the finite source-drain resistance of an input transistor in the circuit. These and other potential advantages will become readily apparent from the detailed description of exemplary embodiments below.

BRIEF DESCRIPTION OF THE DRAWINGS

FIG. 1 is a diagram showing a conventional source follower circuit.

FIG. 2 is a diagram showing a conventional super-source follower circuit.

DETAILED DESCRIPTION

Figure 3:
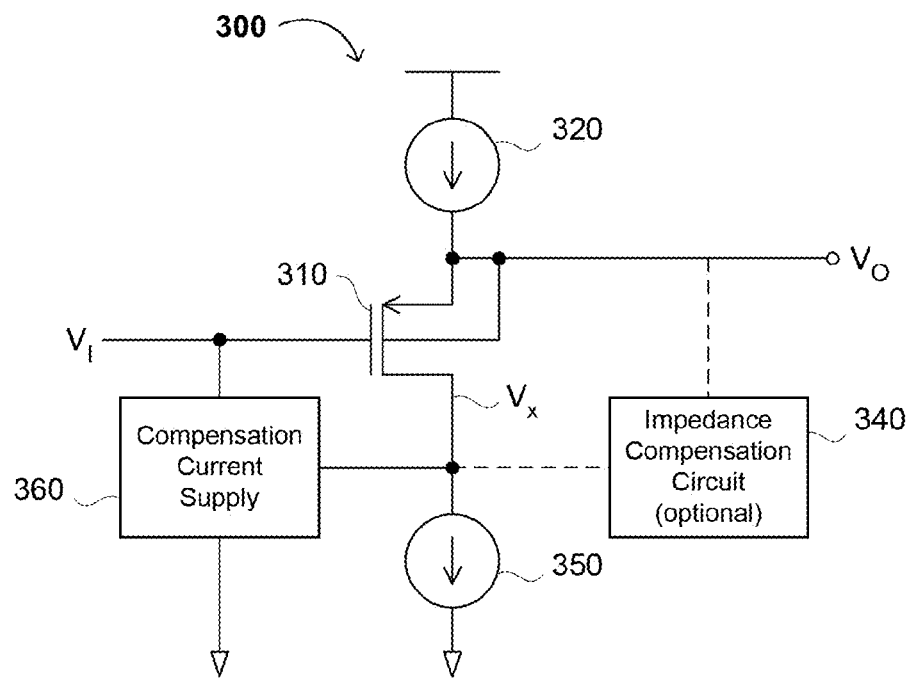
FIG. 3 is a diagram showing an exemplary single-ended circuit with a compensation current supply and optional impedance compensation circuit.

Reference will now be made in detail to various embodiments of the invention, examples of which are illustrated in the accompanying drawings. While the invention will be described in conjunction with exemplary embodiments provided below, the embodiments are not intended to limit the invention. On the contrary, the invention is intended to cover alternatives, modifications and equivalents that may be included within the scope of the invention as defined by the appended claims. Furthermore, in the following detailed description, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, algorithm, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device) that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "generating," "determining," "manipulating," "transforming," "displaying," "setting," "storing," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Also, for convenience and simplicity, the terms "data," "code," "data stream," "waveform," "signal," and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings. In addition, the terms "fixed," "static" and "predetermined" generally refer to a value, quantity, parameter, constraint, condition, state, process, procedure, method, practice, or combination thereof that is, in theory, variable, but is typically set in advance and not varied thereafter when in use.

The invention, in its various aspects, will be explained in greater detail below with regard to exemplary embodiments.

Exemplary Circuits

FIG. 3 illustrates an exemplary source follower circuit 300 in accordance with an embodiment of the present invention. The source follower circuit includes an input transistor 310, a current device 320, a fixed (or static) current supply 350, and a dynamic current supply 360. As shown, input transistor 310 comprises a single transistor; however other topologies are possible. For example, input transistor 310 may include multiple transistors in parallel and/or series configuration, such as complementary MOS transistors. As a result, the source follower circuit 300 can be configured as an amplifier and/or buffer circuit comprising one or more transistors configured to receive input signal $V_I$. In some embodiments, the amplifier/buffer circuit can include transistors having an identical conductivity type as input transistor 310. However, one or more transistors with opposite conductivity type may be employed.

In some examples, input transistor 310 is a metal-oxide-semiconductor (MOS) transistor. However, other transistors are also contemplated in accordance with some embodiments of the present invention. It is further contemplated that, while the exemplary input transistor 310 is a p-channel MOS transistor, it is within the abilities of those skilled in the art to construct circuits in accordance with the present invention with alternative polarity (e.g., complementary) MOS input transistors (i.e., n-channel MOS transistors). Similarly, those skilled in the art can practice the present invention with other types of input transistors, including but not limited to bipolar junction transistors, junction field effect transistors, insulated gate bipolar transistors, metal insulator semiconductor field effect transistors, etc. Moreover, the present invention is not limited to circuits having enhancement-mode MOS input transistors, but rather, depletion-mode MOS input transistors may also be used.

Current device 320 and/or static current supply 350 may be conventional, for example, one or both may comprise resistive, active, or transistor current sources. In some examples, current device 320 comprises a transistor current source (e.g., a PMOS transistor or an NPN bipolar junction transistor) receiving a fixed or variable bias (e.g., applied to the gate or base) or a Wilson current source. The static current supply 350 can comprise a Widlar current source or a transistor current source (e.g., an NMOS transistor or a PNP bipolar junction transistor) receiving a fixed or variable bias (e.g., applied to the gate or base). The current generated by current device 320 generally drives the output load, and the static current supply 350 sinks current from node $V_X$. In accordance with various embodiments, the current generated by static current supply 350 (along with feedback provided by impedance compensation circuit 340) compensates for non-idealities in the output resistance of current device 320. Thus, in some embodiments, the current produced by static current supply 350 can be substantially less than the current produced by current device 320.

The source follower circuit 300 includes a variable (or compensation) current supply 360 configured to provide a dynamic current to the input transistor 310. The dynamic current generated by supply 360 can compensate for a finite resistance between the source and drain terminals of input transistor 310 by sinking a variable (or dynamic) current from node $V_X$. Because the source-drain resistance of conventional MOS transistors is not infinite, a current will flow through the source and drain terminals. This current is generally modulated by the output voltage $V_O$, resulting in non-ideal AC performance of the source follower circuit 300. Because variations in the output voltage $V_O$ of the source follower circuit 300 generally correspond to variations in input voltage $V_I$, the source-drain current through the source follower circuit 300 is primarily modulated by variations in the input voltage $V_I$. By sourcing a current into the drain terminal of input transistor 310 that varies dynamically with the input voltage $V_I$, an ideal AC performance can be approached or achieved. Thus, in some embodiments, the compensation current of the dynamic current supply 360 has a magnitude about equal to an output impedance of the input transistor 310 times a magnitude of the output signal $V_O$. Furthermore, the compensation current can be about 180 degrees out of phase with the source-drain voltage of the input transistor 310 and/or in phase with the current(s) provided by static current supply 350 and current device 320.

Figure 4:
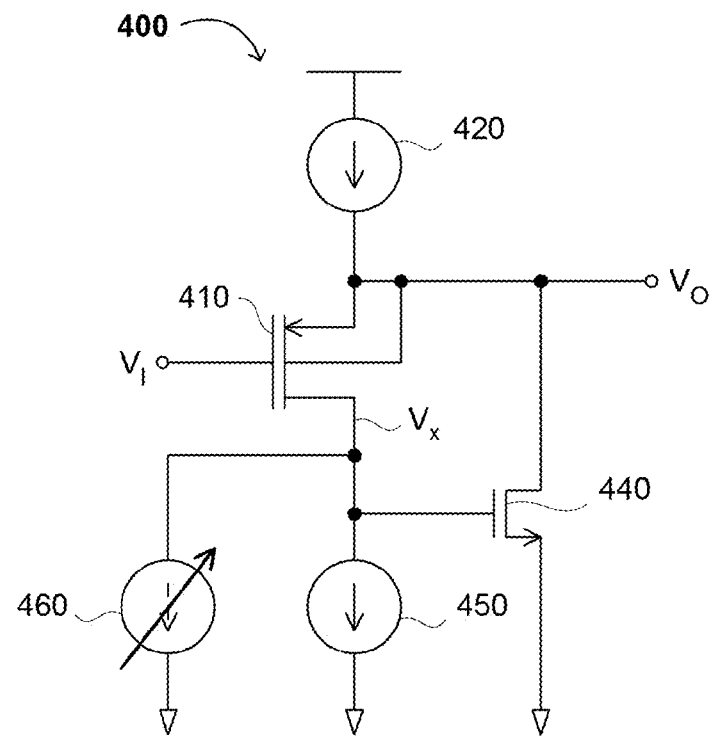
FIG. 4 is a diagram showing an exemplary implementation of the circuit of FIG. 3.

FIG. 4 illustrates an exemplary source follower circuit 400 in accordance with an embodiment of the present invention. The source follower circuit 400 includes a MOS input transistor 410 having a gate terminal configured to receive an input signal $V_I$ and a source terminal receiving a current from current device 420 and producing an output signal $V_O$. Generally, the current device 420 is as described for the current device 320 in FIG. 3, and the current from current device 420 (FIG. 4) is a substantially fixed current. In some examples, the body of the input transistor 410 can be coupled to the source terminal of the input transistor 410 to reduce non-linearity of the gain of the input transistor 410 due to back-gate transconductance.

In further examples, a fixed (or static) current supply 450 is coupled to the drain of input transistor 410, and the static current supply 450 can be configured to compensate for non-idealities in the output resistance of current device 420. Generally, the static current supply 450 is as described for the static current supply 350 in FIG. 3, and the current from static current supply 450 (FIG. 4) is a substantially fixed current that can be in phase with the current of the current device 420.

In further examples, the gate of a transistor (e.g., an NMOS transistor 440) is coupled to the drain of input transistor 410, and the drain of transistor 440 is coupled to the source terminal of the input transistor 410 to form a feedback loop and to reduce non-linearity of the gain of the input transistor 410 due to the output impedance of current device 420 and/or input transistor 410. However, other feedback topologies are contemplated in accordance with some embodiments of the present invention.

A compensation current supply 460 is coupled to the drain terminal $V_X$ of input transistor 410. The compensation current supply 460 can vary the source-drain current through the input transistor 410 in a manner corresponding to variations in input signal $V_I$, thus reducing non-linearity of the gain of the input transistor 410 due to the source-drain resistance of the input transistor 410. As illustrated in FIG. 4, the compensation current supply 460 is configured in parallel with current sink 450, although in other implementations the compensation current supply 460 may be implemented in series with current sink 450.

Figure 5:
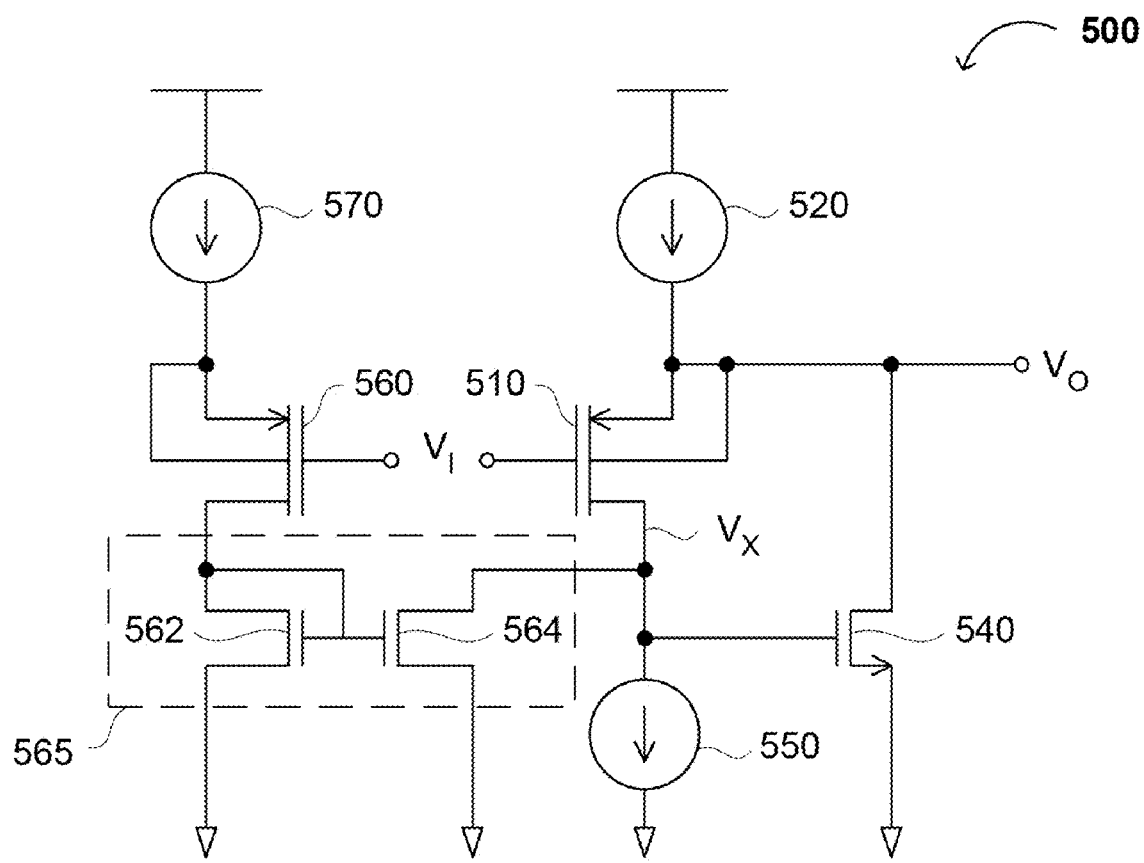
FIG. 5 is a diagram showing another exemplary implementation of the circuit of FIG. 3.

Various embodiments pertain to both single-ended and differential source follower circuits. In some embodiments of the single-ended circuit, the compensation current supply (e.g., dynamic current sink 460) comprises a current mirror configured to provide an equal-magnitude, opposite polarity replica of the input transistor source-drain current to the drain of the input transistor 410. FIG. 5 shows an embodiment of an exemplary single-ended source follower circuit 500 having a current mirror 565 (e.g., NMOS transistors 562, 564). It is to be appreciated that source follower circuit 500 may also be configured as an amplifier and/or buffer circuit.

Referring now to the exemplary illustration of FIG. 5, source follower circuit 500 includes a MOS input transistor 510, a first current device 520, a MOS feedback transistor 540, a static current supply (e.g., static current sink) 550, a MOS compensation transistor 560, current mirror 565, and a second current device 570. Generally, the first and second current devices 520 and 570 are as described for the current devices 320 and 420 in FIGS. 3-4, and each of the currents from current devices 520 and 570 (FIG. 5) is a substantially fixed current. In some examples, the currents from current devices 520 and 570 are substantially the same (e.g., the same bias is applied to both current devices 520 and 570), and in other examples, the current from current device 570 differs from the current from current device 520 (e.g., by an amount enabling the current mirror 565 to sink a dynamic and/or variable current that reduces the gain error due to the source-drain resistance of the input transistor 510). Thus, the second current device 570 can be configured to supply a compensation current that is, in turn, applied to the drain terminal of input transistor 510, as modulated by the compensation transistor 560.

MOS input transistor 510 includes a gate configured to receive an input signal $V_I$, a source terminal receiving a current from current device 520 and producing an output signal $V_O$, and a body coupled to the source terminal of the input transistor 510. In some embodiments, compensation transistor 560 has an identical conductivity type as input transistor 510. However, it is to be appreciated that a transistor with opposite conductivity type may be employed for input transistor 510 and compensation transistor 560. In addition, NMOS feedback transistor 540 includes a gate coupled to the drain of input transistor 510, and the drain of transistor 540 is coupled to the source terminal of the input transistor 510 to form a feedback loop and to reduce non-linearity of the gain of the input transistor 510 due to the output impedance of current device 520 and/or input transistor 510.

In some embodiments, the current mirror 565 includes first and second transistors (e.g., NMOS transistor 562 and NMOS transistor 564) configured to couple the drain terminal of compensation transistor 560 to the drain terminal of input transistor 510, thereby sinking about the same amount of current from each of the drain terminals of compensation transistor 560 and input transistor 510. In some examples, a first source/drain terminal of transistor 562 is coupled to drain terminal of the compensation transistor 560 and a gate of transistor 564. In other examples, the gates of transistors 562 and 564 may be coupled to each other. A first source/drain terminal of transistor 564 can be coupled to the drain terminal of input transistor 510.

In one embodiment, a compensating current is provided to input transistor 510 that has a magnitude about equal to the source-drain resistance of input transistor 510 times output voltage $V_O$. Thus, in such an embodiment, the compensation transistor 560 and the input transistor 510 have the same conductivity or carrier type (e.g., N or P), the same geometries (e.g., width and length), and one or more electrical characteristics (e.g., mobility) that is/are substantially the same. Similarly, current device 570 can have the same carrier type and electrical characteristics as current device 520. However, it is to be appreciated that other configurations are contemplated. For example, the magnitude of currents supplied by current supplies 570 and 520 may have a ratio about inversely equal to the ratio of source-drain resistances of first transistor 560 and input transistor. Similar ratios can also be achieved depending on, among other things, the characteristics of transistors 562 and 564. Those skilled in the art can appropriately select and/or design the electrical characteristics of current supply 570 and transistors 562, and 564 in accordance with embodiments of the present invention.

Figure 6:
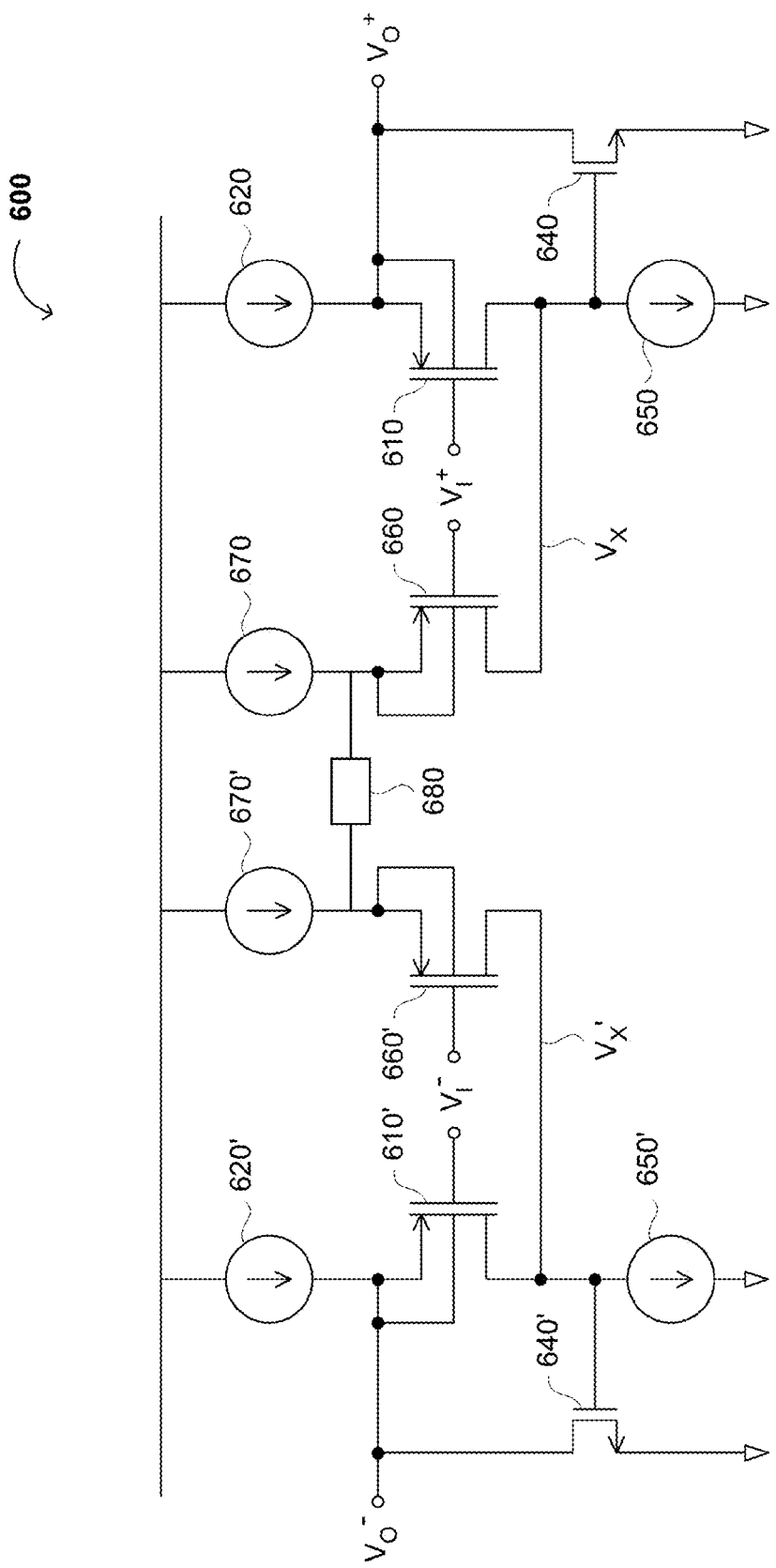
FIG. 6 is a diagram showing an exemplary differential (or double-sided) circuit with a compensation current supply and impedance compensation circuit.

Generally, differential source follower circuits can include a second input transistor configured to receive a complementary input signal. Referring to the exemplary illustration of FIG. 6, a differential source follower circuit 600 comprises a differential input including first input transistor 610 and second input transistor 610' configured to receive a differential input signal (e.g., complementary input signals $V_I^+$ and $V_I^-$). In some examples, the "input signal" may be an analog signal comprising the difference in potential between input signal $V_I^+$ and input signal $V_I^-$. In other examples, the "input signal" may be a digital signal where the input signals $V_I^+$ and $V_I^-$ have opposite digital reference voltage values. Although the exemplary source follower circuit 600 of FIG. 6 is configured to receive input signals $V_I^+$ and $V_I^-$, each of which have a potential greater than or equal to the analog ground potential, it is within the ability of those skilled in the art to practice the present invention with other signaling or logic schemes (e.g., transistor-transistor logic [TTL]).

Differential source follower circuit 600 further comprises current devices 620 and 620', coupled to source terminals of input transistors 610 and 610', respectively. Current devices 620 and 620' are generally configured to provide a fixed or predetermined current that can drive a load at the output $V_O$ of the differential source follower circuit 600. One or both of the current devices 620 and 620' may comprise resistive, active, or transistor current sources. In some examples, current devices 620 and 620' may comprise a transistor current source or Wilson current source. However, other types of current devices are contemplated in accordance with some embodiments of the present invention. In some embodiments, current devices 620 and 620' may have identical electrical characteristics. However, those skilled in the art can practice the present invention with circuits in which current devices 620 and 620' have different current sourcing abilities.

In some embodiments, source follower circuit 600 includes static current supplies 650 and 650' configured to compensate for one or more non-idealities in the gain of the differential source follower circuit 600 (e.g., from the output resistance of current devices 620 and 620', respectively, by providing currents to the drain terminals of input transistors 610 and 610', respectively. In general, static current supplies 650 and 650' sink a fixed, static or predetermined current. Further, in some implementations, feedback transistors 640 and 640' have gates respectively coupled to the source and drain terminals of input transistors 610 and 610', thereby creating first and second feedback loops between the respective source and drain terminals of the input transistors 610 and 610'.

In some embodiments, a dynamic current supply can be coupled to each of input transistor 610 and input transistor 610', generally at the drain terminal. As shown in FIG. 6, the dynamic current supplies include a first transistor 660 having a gate receiving input signal $V_I^+$ and a source coupled to current device 650, and a second transistor 660' having a gate receiving complementary input signal $V_I^-$ and a source coupled to current device 650'. As for the single-ended circuits of FIGS. 3-5, first transistor 660 and second transistor 660' can be configured to compensate for at least part of the gain error due to the source-drain resistance of the input transistors 610 and 610'.

In some embodiments, first compensation transistor 660 and input transistor 610 have the same conductivity type, geometries, and/or one or more electrical characteristics. Similarly, second compensation transistor 660' and current device 670' can have the same type, qualities, geometries, and/or characteristics as input transistor 610' and current device 625. It is also contemplated that, while the polarities of transistors 610, 610', 660, and 660' in the exemplary circuit of FIG. 6 are all the same, in some embodiments of the present invention, different polarities are contemplated. For example, transistors 610, 660 can comprise p-channel MOS transistors, and transistors 610', 660' can comprise n-channel MOS transistors.

In some embodiments, the dynamic current supplies further include third and fourth current devices 670 and 670'. In general, current devices 670 and 670' have the same conductivity type and geometries, and/or one or more of the same electrical characteristics as current devices 620 and 620', respectively. By sourcing a current from current devices 670 and 670' to nodes $V_X$ and $V_{X'}$ dependent on the differential input $V_I$, $V_{I'}$ received by first and second compensation transistors 660 and 660', feedback transistors 640 and 640' can sink some additional current from the differential output node $V_O$, $V_{O'}$, thereby reducing the voltage at the differential output node $V_O$, $V_{O'}$ and compensating for the non-ideality in the gain of input transistors 610 and 610' due to their respective source-drain resistances. However, other configurations are contemplated in accordance with embodiments of the present invention. For example, rather than directly connecting first and second compensation transistors 660 and 660' to nodes $V_X$ and $V_{X'}$, current mirrors such as current mirror 565 in FIG. 5 may be employed to sink the dynamic/compensation current from the drain terminals of the input transistors 610 and 610'.

Figure 7:
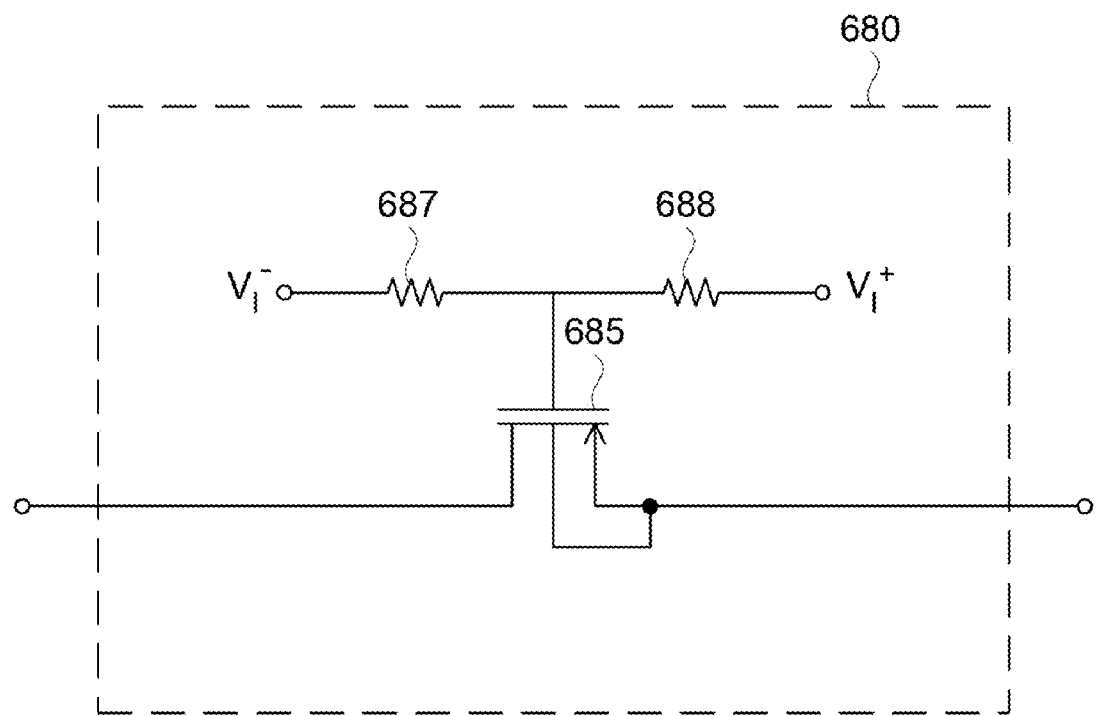
FIG. 7 is a diagram showing an exemplary implementation of the coupling impedance of FIG. 6.

In some embodiments, the dynamic current supplies further include an impedance device 680 coupling the source terminal of first transistor 660 and the source terminal of second transistor 660'. When the impedance of the impedance device 680 is equal to the combined source-drain impedance of the input transistors 610 and 610', the voltage across impedance device 680 will track the output voltage (i.e., the difference in potential between $V_O^+$ and $V_O^-$). In some implementations, and as illustrated in the exemplary illustration of FIG. 7, an exemplary impedance device 680 includes a transistor 683 having source and drain terminals coupled to the source terminals of the first and second transistors 660 and 660' of the dynamic current supplies. In one implementation, the gate terminal of transistor 683 is coupled to a voltage divider network (e.g., including resistances 687 and 688). Resistances 687 and 688 are coupled to input signals $V_I^-$ and $V_I^+$, respectively, thereby setting a quiescent source-drain current across transistor 683. In one implementation, the resistances 687 and 688 in the voltage divider network have the same resistance values. In alternative implementations, the resistance values can be scaled depending on, among other things, the electrical characteristics of current devices 620 and 620' and of input transistors 610 and 610' (as shown in FIG. 6). Other implementations of impedance device 680 are contemplated in accordance with various embodiments.

Exemplary Integrated Circuits Configured to Compensate for Gain Error

Referring back to FIG. 5, in some embodiments, an integrated circuit includes a first p-channel MOS (PMOS) transistor 510 with a gate configured to receive an input signal $V_I$, a source configured to receive a first current (for example, a fixed current from current device 520), and a drain configured to receive a dynamic current (e.g., as sunk by transistor 564 of the current mirror 565). In general, the current sunk by transistor 564 is in phase with the fixed current from current device 520. The integrated circuit further includes an n-channel MOS (NMOS) transistor 540 having a drain coupled to the source of the first PMOS transistor 510 and a gate coupled to the drain of the first PMOS transistor 510. The integrated circuit further includes a second PMOS transistor 560 having a gate configured to receive the input signal $V_I$, a source configured to receive a second current (for example, a current from current device 580), and a drain coupled directly or indirectly to the drain of the first PMOS transistor 510 and configured to provide the dynamic current to the first PMOS transistor 510. The body of one or more transistors 510 and 560 can be coupled to their respective sources. The first PMOS transistor 510 and second PMOS transistor 560 can have substantially identical physical structures. In some examples, the source-drain resistances of the first and second PMOS transistors 510 and 560 are substantially equal to each other (e.g., within +/−20%). However, it is contemplated that embodiments of the present invention contemplate transistors having different physical structures and/or electrical characteristics.

As shown in FIG. 5, the integrated circuit has at least two MOS transistors 562 and 564 configured to couple the drain of second PMOS transistor 560 to the drain of first PMOS transistor 510. For example, the first MOS transistor 562 has a source coupled to the drain of the second PMOS transistor 560, and the second MOS transistor 564 has a source coupled to the drain of the first PMOS transistor 510. The gates of MOS transistors 562 and 564 can be coupled to the source of the first MOS transistor 562. The first and second MOS transistors 562 and 564 can have the same structure as the first and second PMOS transistors 510 and 560 or different structures, as may be determined in accordance with various design choices and/or performance criteria.

In other embodiments, and referring to the exemplary illustration of FIG. 6, the integrated circuit can further include a third PMOS transistor 610' with a gate configured to receive a complementary input signal $V_I^-$, a source configured to receive a third current (for example, a current from current device 620'), and a drain configured to receive a dynamic current. A second NMOS transistor 640' can have a drain coupled to the source of the third PMOS transistor 610' and a gate coupled to the drain of the third PMOS transistor 610'. In some embodiments, a fourth PMOS transistor 660' can have a gate configured to receive the complementary input signal $V_I^-$, a source configured to receive a fourth current (for example, a current from current device 670'), and a drain coupled to the drain of the third PMOS transistor 610'. In general, second and fourth PMOS transistors 660 and 660' are configured to provide the dynamic current to the first and third PMOS transistors 610 and 610'.

In some embodiments, the body of transistors 610' and 660' may be coupled to their respective sources. In some embodiments, third PMOS transistor 610' and fourth PMOS transistor 660' may have one or more substantially identical physical and/or electrical structures, to each other and/or to first and second PMOS transistors 610 and 660, respectively. However, it is contemplated that embodiments of the present invention contemplate transistors having different physical structures.

In some embodiments, the integrated circuit can further include an impedance device 680 configured to couple the source of the second PMOS transistor 660 and the source of the fourth PMOS transistor 660'. In some examples, impedance device 680 may comprise a fifth PMOS transistor (or a third NMOS transistor) with a first source/drain terminal coupled to the source of the second PMOS transistor 660 and a second source/drain terminal coupled to the source of the fourth PMOS transistor 660'. In some examples, the impedance device 680 may have the same source-drain impedance as the first and/or third PMOS transistors, 610 and 610', respectively. In other examples, the impedance device 680 may have a source-drain impedance equal to about twice the source-drain impedance of the first and/or third PMOS transistors, 610 and 610', respectively. In some implementations, the channel area of the fifth PMOS transistor (e.g., transistor 685 in FIG. 7) can be about equal to the sum of the channel areas of the first PMOS transistor 610 and the second PMOS transistor 610'.

Exemplary Methods for Reducing the Non-Linearity of a Source Follower

In some embodiments, methods for reducing the non-linearity of a source follower having an input transistor includes regulating first and second variations in current through the input transistor. The first variation in current may be due to a load receiving an output signal of the source follower. The second variation in current may be due to the source-drain resistance of the input transistor. The first variation can be regulated by sinking or sourcing a static or fixed current to a first source/drain terminal of the input transistor in response to a voltage at a second source/drain terminal of the input transistor. The second variation may be regulated by sinking or sourcing a dynamic or variable current at the second source/drain terminal of the input transistor. Thus, when the first variation is regulated by sourcing a fixed current, the second variation is regulated by sinking a variable current. In some embodiments, the dynamic current is regulated in response to a variation in the input signal.

In a further embodiment, a third variation in current through the input transistor can be regulated. The third variation in current may be due to non-idealities in the output resistance of a current device that sinks or sources the fixed current to the first source/drain terminal of the input transistor. The third variation is generally regulated by sinking or sourcing a static or fixed current to or from the second source/drain terminal of the input transistor, in addition to the regulation of the second variation. However, it is to be appreciated that other bases for regulating the static and dynamic currents are contemplated in accordance with some embodiments of the present invention.

CONCLUSION/SUMMARY

Thus, embodiments of the present disclosure provide circuits and methods for providing current to compensate for losses due to a finite source-drain resistance of an input transistor of a source follower, thus providing improved AC performance.

The foregoing descriptions of embodiments of the present disclosure have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit, comprising:
   a first input transistor including
      a gate configured to receive an input signal,
      a first source/drain terminal configured to produce an output signal responsive to the input signal, and
      a second source/drain terminal;
   a first current device coupled to the first source/drain terminal of the input transistor;
   a first static current supply coupled to the second source/drain terminal of the input transistor; and
   a dynamic current supply coupled to the second source/drain terminal of the input transistor, the dynamic current supply being configured to vary a source-drain current of the input transistor in response to the input signal.

2. The circuit of claim 1, wherein the dynamic current supply comprises a current mirror.

3. The circuit of claim 2, wherein the current mirror comprises a first compensation transistor, the first compensation transistor including:
   a gate configured to receive the input signal;
   a first source/drain terminal coupled to a second current device; and
   a second source/drain terminal configured to control a variable current sourced to or sunk from the second source/drain terminal of the first input transistor.

4. The circuit of claim 3, wherein the first compensation transistor has a same conductivity type as the first input transistor.

5. The circuit of claim 3, wherein:
   the current mirror further comprises a first MOS transistor and a second MOS transistor;
   a first source/drain terminal of the first MOS transistor is coupled to a gate of the first MOS transistor, a gate of the second MOS transistor, and a second source/drain terminal of the first compensation transistor; and
   a first source/drain terminal of the second MOS transistor is coupled to the second source/drain terminal of the first input transistor.

6. The circuit of claim 1, wherein the dynamic current supply provides a compensation current having a magnitude substantially equal to an output impedance of the first input transistor times a magnitude of the output signal.

7. The circuit of claim 1, wherein the dynamic current supply provides a compensation current substantially 180 degrees out of phase with a source-drain voltage of the first input transistor.

8. The circuit of claim 1, wherein the static current supply is in parallel with the dynamic current supply.

9. The circuit of claim 1, further comprising an impedance compensation circuit configured to receive the output signal, the impedance compensation circuit being coupled to the second source/drain terminal of the input transistor.

10. The circuit of claim 9, wherein the impedance compensation circuit comprises a MOS feedback transistor, the MOS feedback transistor including:
    a gate coupled to the second source/drain terminal of the input transistor; and
    a first source/drain terminal coupled to the first source/drain terminal of the input transistor.

11. The circuit of claim 1, further comprising:
    a second input transistor including
       a gate configured to receive a second input signal,
       a first source/drain terminal configured to produce a second output signal responsive to the second input signal, and
       a second source/drain terminal;
    a second current device coupled to the first source/drain terminal of the second input transistor; and
    a second dynamic current supply coupled to the second source/drain terminal of the second input transistor.

12. The circuit of claim 11, wherein the second dynamic current supply is configured to vary a source-drain current of the second input transistor in response to the second input signal.

13. The circuit of claim 12, wherein:
    the first dynamic current supply comprises a first compensation transistor, the first compensation transistor including
       a gate configured to receive the first input signal,
       a first source/drain terminal, and
       a second source/drain terminal coupled to the second source/drain terminal of the first input transistor; and
    the second dynamic current supply comprises a second compensation transistor, the second compensation transistor including
       a gate configured to receive the second input signal,
       a first source/drain terminal, and
       a second source/drain terminal coupled to the second source/drain terminal of the second input transistor.

14. The circuit of claim 13, wherein:
    the first compensation transistor has a same conductivity type as the first input transistor; and
    the second compensation transistor has a same conductivity type as the second input transistor.

15. The circuit of claim 14, further comprising an impedance device between the first source/drain terminal of the first compensation transistor and the first source/drain terminal of the second compensation transistor.

16. An integrated circuit, comprising:
    a first p-channel metal-oxide-semiconductor (PMOS) transistor including
       a gate configured to receive an input signal,
       a source configured to receive a first static current,
       a drain configured to receive a dynamic current, and
       a body coupled to the source of the first PMOS transistor;
    a n-channel metal-oxide-semiconductor (NMOS) transistor including
       a drain coupled to the source of the first PMOS transistor, and
       a gate coupled to the drain of the first PMOS transistor; and
    a second PMOS transistor including a gate configured to receive the input signal,
a source configured to receive a second fixed current,
a drain coupled to the drain of first PMOS transistor, the drain of the second PMOS transistor configured to provide the dynamic current, and
a body coupled to the source of the second PMOS transistor.

17. The integrated circuit of claim 16, further comprising at least two MOS transistors coupling the drain of the first PMOS transistor and the drain of the second PMOS transistor.

18. The integrated circuit of claim 16, further comprising:
a third PMOS transistor including
a gate configured to receive a second input signal,
a source configured to receive a second static current,
a drain configured to receive a second dynamic current, and
a body coupled to the source of the third PMOS transistor;
a second NMOS transistor including
a drain coupled to the source of the third PMOS transistor, and
a gate coupled to the drain of the third PMOS transistor;
a fourth PMOS transistor including
a gate configured to receive the second input signal,
a source configured to receive a fourth fixed current,
a drain coupled to the drain of the third PMOS transistor, and
a body coupled to the source of the fourth PMOS transistor; and
an impedance device coupling the source of the second PMOS transistor and the source of the fourth PMOS transistor.

19. A method for reducing non-linearity in a source follower, the source follower comprising an input transistor receiving an input signal and providing an output signal, the method comprising:
regulating a first variation in a current through the input transistor by sinking or sourcing a first current at a drain terminal of the input transistor in response to a voltage at the drain terminal of the input transistor, a source terminal of the input transistor providing the output signal; and
regulating a second variation in the current through the input transistor by sinking or sourcing a dynamic current at the drain terminal of the input transistor.

20. The method of claim 19, wherein sinking or sourcing the dynamic current comprises regulating the dynamic current in response to a variation in the input signal.

21. A method for reducing non-linearity in a circuit, the circuit comprising an input transistor receiving an input signal and providing an output signal, the method comprising:
regulating a first variation in a current through the input transistor by sinking or sourcing a first current at a first source/drain terminal of the input transistor in response to a voltage at the first source/drain terminal of the input transistor, a second source/drain terminal of the input transistor providing the output signal; and
regulating a second variation in the current through the input transistor by sinking or sourcing a dynamic current at the first source/drain terminal of the input transistor.

22. The method of claim 21, wherein sinking or sourcing the dynamic current comprises regulating the dynamic current in response to a variation in the input signal.

* * * * *